United States Patent [19]
Konishi

[11] Patent Number: 5,374,779
[45] Date of Patent: Dec. 20, 1994

[54] ELECTRO-MAGNETIC WAVE SHIELDING STRUCTURE

[75] Inventor: Yoshihiro Konishi, Sagamihara, Japan

[73] Assignee: Uniden Corporation, Ichikawa, Japan

[21] Appl. No.: 88,055

[22] Filed: Jul. 8, 1993

[30] Foreign Application Priority Data

Jul. 22, 1992 [JP] Japan .................. 4-195375

[51] Int. Cl.$^5$ .............................................. H05K 9/00
[52] U.S. Cl. .............................. 174/35 R; 174/35 MS; 331/67
[58] Field of Search .......... 174/35 R, 35 GC, 35 MS, 174/50.59; 331/67; 156/71; 361/600

[56] References Cited

U.S. PATENT DOCUMENTS

| | | | |
|---|---|---|---|
| 4,243,460 | 1/1981 | Nagler | 156/275 |
| 4,371,742 | 2/1983 | Manly | 174/36 |
| 4,408,255 | 10/1983 | Adkins | 361/382 |
| 4,539,433 | 9/1985 | Ishino et al. | 174/35 MS |
| 4,749,625 | 6/1988 | Obayashi et al. | 428/624 |
| 4,948,922 | 8/1990 | Varadan et al. | 174/35 GC |
| 4,965,408 | 10/1990 | Chapman et al. | 174/35 MS |
| 5,047,260 | 9/1991 | Durand | 427/54.1 |
| 5,260,128 | 11/1993 | Ishii et al. | 428/328 |
| 5,286,318 | 2/1994 | Sims et al. | 156/71 |

FOREIGN PATENT DOCUMENTS

| | | |
|---|---|---|
| 0256350A1 | 2/1988 | European Pat. Off. |
| 2130786A | 6/1984 | United Kingdom |
| 2159822A | 12/1985 | United Kingdom |
| 2225327A | 5/1990 | United Kingdom |

*Primary Examiner*—Leo P. Picard
*Assistant Examiner*—Christopher Horgan
*Attorney, Agent, or Firm*—Stevens, Davis, Miller & Mosher

[57] ABSTRACT

For sufficiently shielding an undesired electro-magnetic wave from penetrating into a communication apparatus, for instance, a car telephone through stray coupling, or leaks therefrom, an electronic circuit substrate and a case of the communication apparatus are formed of flat plates which consist of insulating material comprising magnetic material. One side surface of the flat plates are covered with conductive films. The communication apparatus itself is accommodated in the case and an electric power source connecting cable is wrapped by a similar arrangement, so as to remarkably reduce obstructions caused by undesired waves and other communications in comparison with the conventional arrangement.

16 Claims, 3 Drawing Sheets

FIG_1A
PRIOR ART
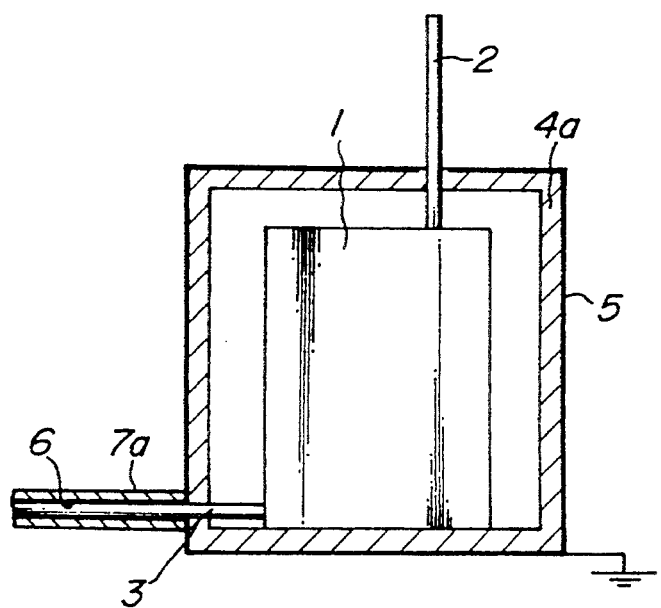
FIG_1B
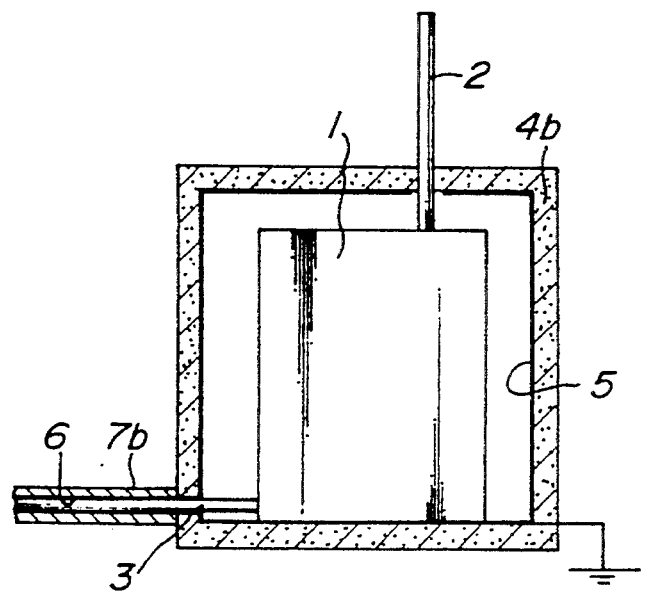

FIG_2
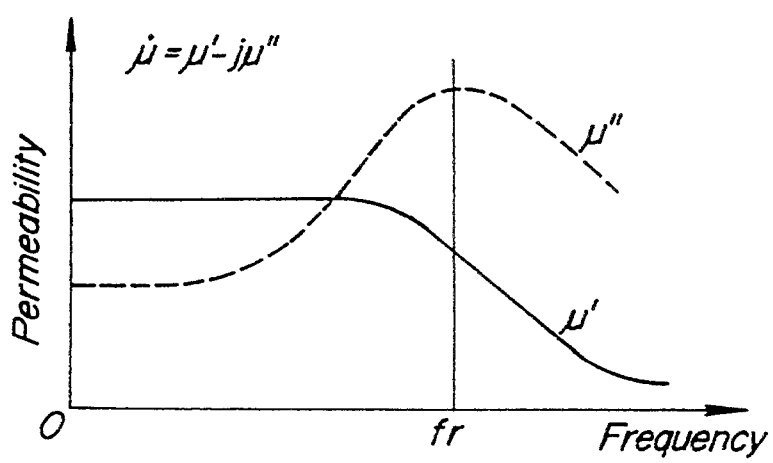
FIG_3
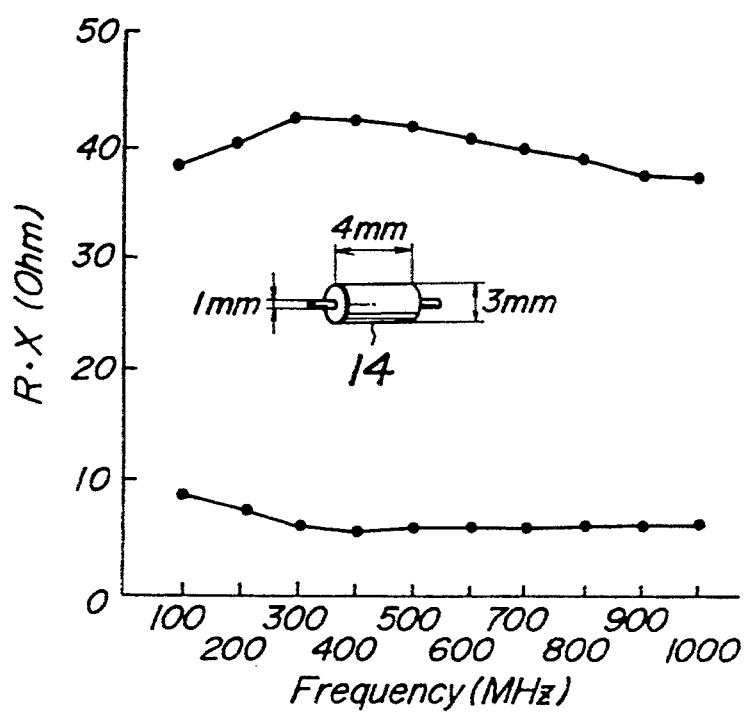

ELECTRO-MAGNETIC WAVE SHIELDING STRUCTURE

BACKGROUND OF THE INVENTION

1. Field of the Invention

The present invention relates to an electro-magnetic wave shielding structure which is provided for communication apparatus used for both transmitting and receiving, or for only receiving in ultra-short wave ranges and others, for example, a car-telephone. The invention relates particularly to such a shielding structure, which is arranged so as to sufficiently prevent disturbing interferences from itself and other devices, such that non-desired communication waves are not intermixed or emitted.

2. Related Art Statement

Generally, in the communication apparatus of this kind used, for instance, in ultra-short wave range, external waves, other than a desired wave, cause receiving obstructions by stray-coupling with receiver circuits, while a local oscillator output, leaking from a receiver circuit, disturbs other receivers. Thus, communication disturbances are frequently caused upon both to a particular communication apparatus and other communication apparatuses by undesired external waves other than desired waves transmitted and received through antennas, which intermix in the receiver circuit, or, by obstructive waves having undesired frequencies and emitted from the receiver circuit.

For preventing such communication disturbances, disturbance preventing means for entirely shielding cases of the apparatuses has been conventionally employed, such that essential portions of transmitter and receiver circuits are shielded through conductor materials suitable for cutting off leakage and stray coupling. Surfaces of insulating material cases made of plastics and the like for accommodating the communication apparatuses are applied with conductivity, and further electric power source connecting cables are wrapped with a metal net sheath covered by gummous material.

However, the shape and the size of shielding conductive materials applied on semi-conductor substrates provided for the communication apparatus circuit closely resemble wave lengths of disturbing waves. As a result, those conductive materials are operated as antennas for the disturbing waves. So that, particularly the leakage of the local oscillator output cannot be sufficiently suppressed by these means and hence frequently disturbs other receivers. Consequently, the sufficient shielding of non-desired waves has been a conventional problem.

SUMMARY OF THE INVENTION

An object of the present invention is to provide an electro-magnetic wave shielding structure for sufficiently preventing penetration of an undesired external wave and the leakage of an undesired internal wave, other than a predetermined desired wave, so as to solve the aforesaid conventional problem.

An electro-magnetic wave shielding structure according to the present invention is featured in that a substrate and a case are formed of flat plates consisting of insulating material comprising magnetic material presenting magnetic loss at least in one side superficial portion. A conductive thin film is provided in contact with the superficial portion comprising magnetic material, and an electronic circuit provided on the substrate is accommodated in said case.

Accordingly, by employing the electro-magnetic wave shielding structure according to the present invention, that obstructions affect a particular communication apparatus and other communication obstructions, which are frequently caused, for instance, in car telephones in which mutual communication disturbances have been conventionally caused, are substantially sufficiently prevented.

BRIEF DESCRIPTION OF THE DRAWINGS

For the better understanding of the invention, reference is made to the accompanying drawings, in which:

FIG. 1A is a cross-sectional view showing an outlined arrangement of a conventional communication apparatus;

FIG. 1B is a cross-sectional view schematically showing an outlined arrangement of an undisturbed communication apparatus according to the present invention;

FIG. 2 is a characteristic curve showing an example of frequency characteristics of real and imaginary parts of a permeability of ferrite;

FIG. 3 is a characteristic curve showing an example of frequency characteristics of an impedance of a ferrite loaded line;

Figure 4:
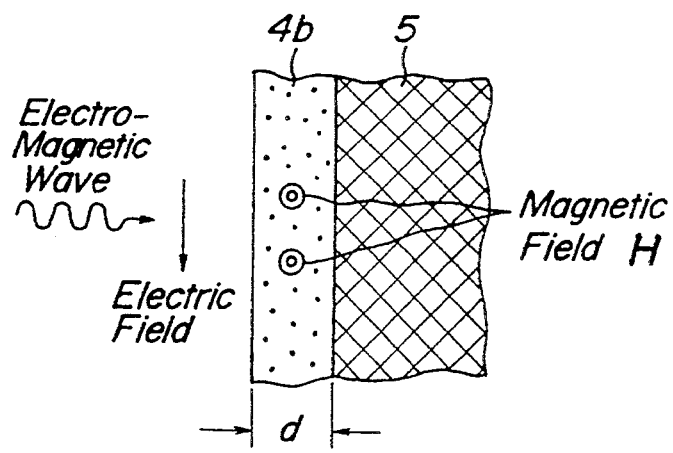
FIG. 4 is a diagram showing an explanation of the principle of the present invention.

Throughout different views of the drawings, 1 is a communication apparatus in itself, 2 is an antenna, 3 is an electric power source connecting cable, 4a is an insulating material case, 4b is a case of insulating material comprising magnetic material, 5, 5a, 5b and 5c are conductive films, 6 is a conductive clothing, 7a is an insulating material outer clothing, 7b is a flexible outer clothing of insulating material comprising magnetic material, 8 is a window, 9 is an oscillator, 10 is a substrate of insulating material comprising magnetic material, 11 is a film of insulating material comprising magnetic material, and 12 is a ferrite intermixed paint.

DESCRIPTION OF THE PREFERRED EMBODIMENTS

Preferred embodiments of the present invention will be described in detail by referring to the accompanying drawings hereinafter.

At the outset, an example of the outlined arrangement of the electro-magnetic wave shielding structure according to the present invention is schematically shown in FIG. 1B in comparison with the conventional arrangement shown in FIG. 1A.

In the conventional arrangement of the communication apparatus of this kind as shown in FIG. 1A, the communication apparatus in itself 1 is accommodated in an insulating material case 4a shielded by applying a conductive film 5 on its surrounding outer surface, a transmitting and receiving antenna 2 protrudes out of the case 4a, and an electric power source connecting cable 3 is wrapped by a conductive clothing 6, for instance, a wire mesh, which is covered by an insulating material outer clothing 7a.

However, the intermixing and the leakage of undesired waves cannot be really prevented sufficiencies through the shielded case formed according to the aforesaid conventional technical conception, so that it is the actual circumstance that various communication obstructions are caused internally and to other communication apparatuses.

In contrast with the above described conventional arrangement, in the undisturbed communication apparatus according to the present invention, as schematically shown in FIG. 1B, with regard to the case in which the communication apparatus in itself 1 is accommodated and from which the antenna 2 protrudes, a paint in which an appropriate amount of particles or powders of ferri-magnetic material, for instance, ferrite is uniformly mixed is applied on inner or outer surfaces of the insulating material case 4b as a conductive film 5, while the electric power source connecting cable 3 is wrapped by the conductive clothing 6, which is for instance, a wire mesh similarly to the conventional case, and further covered by the flexible insulating material clothing 7b consisting of gummous insulating material in which an appropriate amount of particles or powders of ferri-magnetic material, for instance, ferrite is mixed. Further, the conductive film 5 applied on the inner surface of the case 4b and the conductive clothing 6 covering the electric power source connecting cable 3 are earthed (grounded). In this connection, another case made of plastics may be provided inside or outside of the thus arranged case for reinforcing it.

In addition to the above, by referring to the factual circumstance of communication obstruction, according to the present invention, although it is similar to the conventional technical conception for inclusively shielding the intermixing and the leakage of undesired waves by a case in which the communication apparatus in itself is accommodated, electronic circuit substrates provided in the communication apparatus itself and the case for accommodating it are arranged on the basis of a novel principle of shielding as mentioned hereinafter, so as to extremely sufficiently and surely shield undesired waves in comparison with the conventional arrangement.

According to the present invention, insulating material layers comprising magnetic material are formed on conductive films applied on a case used for a communication apparatus and an electronic circuit substrate provided therein, so as to afford magnetic loss into a path of electro-magnetic wave current, such as paths through which an electro-magnetic wave derived from an oscillator reaches an electro-magnetic wave gateway of the case. For instance, antennas and openings are provided with magnetic loss.

Accordingly, the magnetic properties of the magnetic material used for the above, specifically of ferrite, will be investigated as follows.

The frequency dependency of the real part $\mu'$ and the maginary part $\mu''$ of the complex permeability $\mu'$ of ferrite is become as shown in FIG. 2. In other words, the real part $\mu'$ of the complex permeability $\mu'$ of the ferrite continuously decreases prior to the magnetically resonant frequency fr in comparisons to the increase of the frequency, while the imaginary part $\mu''$ thereof continuously increases in comparisons to the increased frequency and reaches its maximum at the magnetic resonant frequency fr. As a result, the relation $\mu'' \geq \mu'$ is obtained in a higher frequency range. So that, when a lead wire presenting an inductance L in vacuum is loaded with ferrite, the impedance of this loaded lead wire becomes j $\omega\mu'L + \omega\mu''L$ and hence the resistance of the imaginary part $\omega\mu''L$ is added to the resistance of the real part $\omega\mu'L$ and further, as shown in FIG. 2, the real part $\mu'$ decreases in comparisons to the increased frequency. Consequently, as is apparent from experimental data as shown in FIG. 3, the impedance of the ferrite-loaded lead wire in the higher frequency range substantially becomes a fixed value as follows.

$\omega\mu''L \simeq$ constant

In this connection, when the electro-magnetic wave current derived from the oscillator flows through the conductive film 5 loaded with ferrite 4b as shown in FIG. 4, a magnetic field H is generated in the loaded conductive film 5 and hence a resistance R based on this magnetic field H is generated in the conductive film 5 concerned.

When it is assumed that the thickness of the loading ferrite is d, the series resistance R which is expressed by the following equation (1) is inserted through the path of the electro-magnetic wave current I.

$R = d/\omega \cdot \mu''$ (1)

So that, when this resistance R through the electromagnetic wave current path is increased by ferrite loading, the electro-magnetic wave is absorbed by the loaded ferrite and hence the current flowing through the conductive film 5 can be attenuated. As a result, the intensity of the electro-magnetic wave which reaches the antenna and the openings of the case from the oscillator provided therein can be extremely reduced.

Although the case for accommodating the wireless communication apparatus is formed of the above mentioned electro-magnetic wave shielding structure, it is frequently required to provide a liquid crystal indicator or an operating push-button in the traffic communication apparatus so that a window or an opening is provided through the accommodating case. In this situation, even if the shielding is effected by applying conductive films 5a and 5b on the inner surface of the case 4b made of plastics which is intermixed with ferrite and on the rear surface of the printing substrate 10 respectively, as shown in FIG. 5, the conductive film 5b applied on the printing substrate 10 is excited by the electro-magnetic wave derived from the oscillator which is accommodated in the case so as to be operated as a radiator, so that it is resulted that the thus excited electro-magnetic wave is radiated through the window 8 or the crevice of the case.

Figure 5:
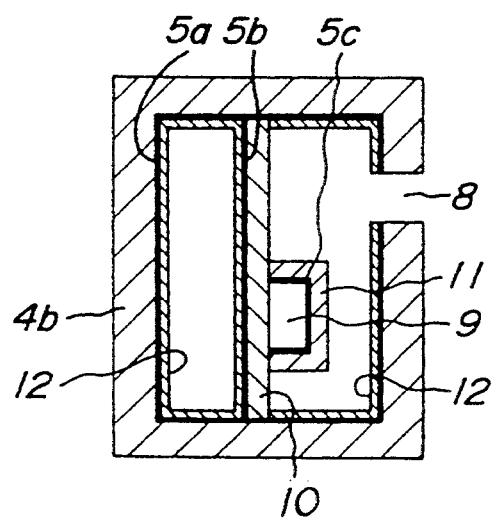
FIG. 5 is a cross-sectional view schematically showing another example of an outlined arrangement of the undisturbed communication apparatus according to the present invention.

It is effective for preventing the radiation of the thus leaked electro-magnetic wave that, as shown in FIG. 5, the conductive film 5a on the inner surface of the case and the conductive film 5b on the printing substrate 10 arranged therein are applied with ferrite-mixed paints 12, so as to form the electro-magnetic wave shielding structure shown in FIG. 4. In this connection, it is effective also that, as shown in FIG. 5, magnetic materials having magnetic loss, for instance, ferrite particles are intermixed in insulating materials, for instance, plastics forming the case.

As is apparent form the above description, according to the present invention, on the basis of the aforesaid novel principle of shielding, undesired electro-magnetic waves other than predetermined desired waves, radiated from the antenna 2 protruded from the case or taken in by coupling with the antenna 2, which cause internal obstruction and obstructions of other communications, are remarkably attenuated in comparison with the conventional situation. In addition thereto, undesired waves passing through the antenna 2 are removed through filtering circuits similarly as the conventional situation. Consequently, particularly evident effects, such that the internal communication obstruction caused and obstructions to other communication apparatuses by undesired waves are extremely reduced in comparison with the conventional situation, can be obtained.

What is claimed is:

1. An electro-magnetic wave shielding structure for an electronic device, said shielding structure comprising:

a case, defining a hollow interior, comprising a first insulation material including first magnetic material which causes magnetic loss in at least one superficial portion of said case;

a conductive film disposed on said superficial portion of said case; and a housing, for housing at least a portion of said electronic device, disposed within said hollow interior, said housing comprising a second insulation material including second magnetic material which causes magnetic loss in at least one superficial portion of said housing.

2. An electro-magnetic wave shielding structure as claimed in claim 1, wherein an electric power source cable for supplying power to said electronic device is wrapped by an outer clothing formed of flexible insulating material comprising magnetic material, an inner face of said clothing being covered with a conductive film.

3. An electro-magnetic wave shielding structure as claimed in claim 1, wherein said case has a window formed therethrough.

4. An electro-magnetic wave shielding structure as claimed in claim 1, wherein said case is formed of flat plates.

5. An electro-magnetic wave shielding structure as claimed in claim 1, wherein said first insulating material is identical to said second insulating material.

6. An electro-magnetic wave shielding structure as claimed in claim 1, wherein said first magnetic material comprises ferri-magnetic powder and said first insulation material is intermixed substantially uniformly with said ferri-magnetic powder.

7. An electro-magnetic wave shielding structure as claimed in claim 6, wherein said second magnetic material comprises ferri-magnetic powder and said second insulation material is intermixed substantially uniformly with said ferri-magnetic powder.

8. An electro-magnetic wave shielding structure as claimed in claim 1, further comprising a ferrite intermixed paint disposed on said conductive film.

9. An electro-magnetic wave shielding structure for an electronic communication device, said shielding structure comprising:

a case, defining a hollow interior, comprising a first insulation material including first magnetic material which causes magnetic loss in at least one superficial portion of said case;

a conductive film disposed on said superficial portion of said case; and a housing, for housing an oscillator of said electronic communication device, disposed within said hollow interior, said housing comprising a second insulation material including second magnetic material which causes magnetic loss in at least one superficial portion of said housing.

10. An electro-magnetic wave shielding structure as claimed in claim 9, wherein an electric power source cable for supplying power to said electronic device is wrapped by an outer clothing formed of flexible insulating material comprising magnetic material, an inner face of said clothing being covered with a conductive film.

11. An electro-magnetic wave shielding structure as claimed in claim 9, wherein said case has a window formed therethrough.

12. An electro-magnetic wave shielding structure as claimed in claim 9, wherein said case is formed of flat plates.

13. An electro-magnetic wave shielding structure as claimed in claim 9, wherein said first insulating material is identical to said second insulating material.

14. An electro-magnetic wave shielding structure as claimed in claim 9, wherein said first magnetic material comprises ferri-magnetic powder and said first insulation material is intermixed substantially uniformly with said ferri-magnetic powder.

15. An electro-magnetic wave shielding structure as claimed in claim 14, wherein said second magnetic material comprises ferri-magnetic powder and said second insulation material is intermixed substantially uniformly with said ferri-magnetic powder.

16. An electro-magnetic wave shielding structure as claimed in claim 9, further comprising a ferrite intermixed paint disposed on said conductive film.

* * * * *